United States Patent
Ding et al.

(10) Patent No.: US 11,104,815 B2
(45) Date of Patent: Aug. 31, 2021

(54) HYDROPHYLIC SEMICONDUCTING SINGLE-WALLED CARBON NANOTUBE INKS

(71) Applicant: National Research Council of Canada, Ottawa (CA)

(72) Inventors: Jianfu Ding, Ottawa (CA); Zhao Li, Orleans (CA); Patrick Malenfant, Orleans (CA)

(73) Assignee: National Research Council of Canada, Ottawa (CA)

( * ) Notice: Subject to any disclaimer, the term of this patent is extended or adjusted under 35 U.S.C. 154(b) by 0 days.

(21) Appl. No.: 16/907,409

(22) Filed: Jun. 22, 2020

(65) Prior Publication Data

US 2020/0317937 A1    Oct. 8, 2020

Related U.S. Application Data

(62) Division of application No. 16/068,298, filed as application No. PCT/CA2016/050448 on Apr. 19, 2016, now Pat. No. 10,723,895.

(Continued)

(51) Int. Cl.
*C09D 11/00* (2014.01)
*H01B 1/00* (2006.01)
(Continued)

(52) U.S. Cl.
CPC ............ *C09D 11/03* (2013.01); *C01B 32/159* (2017.08); *C01B 32/172* (2017.08); *C08G 61/02* (2013.01);
(Continued)

(58) Field of Classification Search
CPC .... H01B 1/00; H01B 1/24; C09C 1/44; C09C 3/10; C09D 11/00; C09D 11/03;
(Continued)

(56) References Cited

U.S. PATENT DOCUMENTS

| 5,900,327 A | 5/1999 | Pei et al. |
| 7,960,037 B2 | 6/2011 | Liu et al. |

(Continued)

FOREIGN PATENT DOCUMENTS

| JP | 5292857 A | 9/2009 |
| JP | 5470763 A | 1/2010 |

(Continued)

OTHER PUBLICATIONS

Reitzel et al "Self-Assembly of Conjugated Polymers at the Air/Water Interface. Structure and Properties of Langmuir and Langmuir-Blodgett Films of Amphiphillic Regioregular Polythiophenes", J. Am. Chem. Soc. 2000, 122, 5788-5800.*

(Continued)

*Primary Examiner* — Mark Kopec
(74) *Attorney, Agent, or Firm* — Brunet & Co., Ltd.; Hans Koenig; Robert Brunet (57) ABSTRACT

A single-walled carbon nanotube composition includes single-walled carbon nanotubes substantially enriched in semiconducting single-walled carbon nanotubes in association with a polymer having one or more oligoether side groups. The oligoether side groups render the composition dispersable in polar organic solvents, for example alkyl carbitols, permitting formulation of ink compositions containing single-walled carbon nanotubes substantially enriched in semiconducting single-walled carbon nanotubes. Such ink compositions may be readily printed using common printing methods, such as inkjet, flexography and gravure printing.

14 Claims, 5 Drawing Sheets

Related U.S. Application Data (60) Provisional application No. 62/276,603, filed on Jan. 8, 2016.

(51) Int. Cl.

| | | |
|---|---|---|
| *C08G 61/00* | (2006.01) | |
| *C09D 11/03* | (2014.01) | |
| *C09D 11/52* | (2014.01) | |
| *C09D 11/102* | (2014.01) | |
| *C08G 61/02* | (2006.01) | |
| *H05K 1/09* | (2006.01) | |
| *C01B 32/159* | (2017.01) | |
| *C08G 61/12* | (2006.01) | |
| *C01B 32/172* | (2017.01) | |
| *C09D 11/037* | (2014.01) | |
| *H01B 1/24* | (2006.01) | |
| *C08K 3/04* | (2006.01) | |
| *C08L 65/00* | (2006.01) | |

(52) U.S. Cl.
CPC ............ *C08G 61/122* (2013.01); *C08K 3/041* (2017.05); *C08L 65/00* (2013.01); *C09D 11/037* (2013.01); *C09D 11/102* (2013.01); *C09D 11/52* (2013.01); *H01B 1/24* (2013.01); *H05K 1/095* (2013.01); *H05K 1/097* (2013.01); *C01B 2202/02* (2013.01); *C01B 2202/22* (2013.01); *C08G 2261/148* (2013.01); *C08G 2261/1424* (2013.01); *C08G 2261/3142* (2013.01); *C08G 2261/3221* (2013.01); *C08G 2261/411* (2013.01); *H05K 2201/026* (2013.01); *H05K 2201/0323* (2013.01)

(58) Field of Classification Search
CPC ........ C08G 61/00; B82Y 10/00; B82Y 30/00; B82Y 40/00
See application file for complete search history.

(56) References Cited

U.S. PATENT DOCUMENTS

| | | | |
|---|---|---|---|
| 10,723,895 B2 * | 7/2020 | Ding | ........................ H01B 1/24 |
| 2006/0118768 A1 | 6/2006 | Liu et al. | |
| 2006/0189822 A1 * | 8/2006 | Yoon | .................... C07C 43/1745 |
| | | | 560/130 |
| 2007/0078215 A1 | 4/2007 | Yoon et al. | |
| 2009/0267060 A1 | 10/2009 | Forrest et al. | |

FOREIGN PATENT DOCUMENTS

| | | |
|---|---|---|
| JP | 2010180263 A | 8/2010 |
| JP | 2013523912 A | 6/2013 |
| WO | 2009/126918 A1 | 10/2009 |
| WO | 2010/036397 A2 | 4/2010 |
| WO | 2015/024115 A1 | 2/2015 |

OTHER PUBLICATIONS

Shao et al "A water-soluble polythiophene for organic field-effect transistors", Polymer Chemistry, 2013, 4, 5270-74.*
Zhao et al "Selective Dispersion of Single-Walled Carbon Nanotubes with Phenylene Based pi-Conjugated Polymers", ECS Trans. 13,31-40.*
Ikeda et al "Single-Walled Carbon Nanotubes Template the One-Dimensional Ordering of a Polythiophene Derivative", Organic Letters 2006, vol. 8, No. 24, 5489-92.*
International Search Report and Written Opinion on PCT/CA2016/050448 dated Oct. 5, 2016.
Bjornholm T, et al. (1998) J. Am. Chem. Soc. 120, 7643-7644.
De Boer B, et al. (2002) Macromolecules. 35, 6883-6892.
Ding J, et al. (2014) Nanoscale. 6, 2328.
Stay D and Lonergan MC. (2013) Macromolecules. 46, 4361-4369.
Stranks SD, et al. (2013) Small. 9(13), 2245-2249. (Abstract).
Stranks SD, et al. (2013) Advanced Materials. 25(31), 4365-4371.
Wang H, et al. (2015) Small. 11(1), 126-133.
Supplemental European Search Report dated May 6, 2019 on European application 16882816.8.
Office Action dated May 21, 2019 on European application 16882816.8.
Office Action dated Nov. 4, 2019 on European application 16882816.8.
Office Action dated Dec. 11, 2019 on Japanese Patent Application 2018-535398.
Office Action dated Dec. 12, 2019 on Taiwan Patent Application 105124008.
Office Action dated Mar. 9, 2020 on Chinese Patent Application 2016800814990.

* cited by examiner

HYDROPHYLIC SEMICONDUCTING SINGLE-WALLED CARBON NANOTUBE INKS

CROSS-REFERENCE TO RELATED APPLICATIONS

This application is a divisional application of U.S. Ser. No. 16/068,298 filed Jul. 5, 2018, which is a national phase entry of International Application PCT/CA2016/050448 filed Apr. 19, 2016 and claims the benefit of United States Provisional Patent Application U.S. Ser. No. 62/276,603 filed on Jan. 8, 2016, the entire contents of all of which are herein incorporated by reference.

FIELD

This application relates to carbon nanotubes.

BACKGROUND

Processes to produce single-walled carbon nanotubes (SWCNT) typically produce a mixture of semiconducting single-walled carbon nanotubes (sc-SWCNT) and metallic single-walled carbon nanotubes (m-SWCNT). sc-SWCNT typically forms about 75 wt % of the mixture in as-produced SWCNT. For application to semiconductor devices, SWCNT of higher purity is desired, as the fully conductive m-SWCNT may interfere with proper functioning of semiconductor devices.

Significant progress in the purification of sc-SWCNT in recent years makes this type of material highly promising for printable electronic applications. Thin film transistors (TFT) with mobilities higher than 30 and on/off ratios above 106 can now be readily achieved (Ding 2014; Ding 2015). However, to make printed circuits with integrated TFT devices remains a challenge. The major issue for this challenge is related to a lack of proper sc-SWCNT inks for industrial printing, especially for roll-to roll printing. Current purification techniques only provide sc-SWCNT dispersions in either aqueous or non-polar organic solvents. sc-SWCNT dispersions in aqueous solution are stabilized by large amounts of surfactant, usually with a weight ratio of 1000/1 of surfactant to nanotubes. The large amount of surfactant prevents their formulation into relevant inks for common printing techniques such as gravure and flexo. Though the conjugated polymer used to stabilize the nanotube dispersion in a non-polar organic solvent such as toluene is at a low weight ratio (usually 1/1 to about 5/1), and does not show significant deleterious effects on device performance (mobility; on/off), this type of dispersion is also difficult to formulate due to a lack of dispersability in common solvents used in commercial printing, where polar organic solvents with a higher viscosity, such as alkyl carbitol, are preferred.

There is little present knowledge related to making stable hydrophilic dispersions of enriched conjugated polymer wrapped sc-SWCNT materials. Ligand exchange has been demonstrated (Stranks 2013a; Stranks 2013b) but not with the intent to dramatically change the dispersability from hydrophobic to hydrophilic systems, nor for the purpose of making relevant ink systems for use in commercial environments. There is no literature of which we are aware, which describes the enrichment of sc-SWCNT in polar organic solvents, such as alkyl carbitols, and which provides an efficient path towards the desired products, obviating the need for ligand exchange should that be preferred. Present literature (Wang 2015) indicates that sorting SWCNTs in a polar solvent like tetrahydrofuran (THF) does not yield selective dispersions of sc-SWCNT.

Polymers with oligoether side groups, such as poly(9,9-di(methoxyethoxyethoxy ethyl)fluorene) have been proposed to form composite materials from as-prepared carbon nanotubes for application as light-emitting materials (Liu 2011). However, such materials have not been reported for the preparation of composite materials with highly purified semi-conducting single-walled carbon nanotubes (sc-SWCNT). Because purified/enriched sc-SWCNT are usually wrapped by surfactants or conjugated polymers based on the technique used for the nanotube purification, composite materials of sc-SWCNT/polymer with oligoether side groups cannot be prepared by simply mixing sc-SWCNT with the corresponding polymer as proposed in Liu 2011.

A method for ligand exchange in which a polyfluorene polymer (PF) is displaced by polythiophene with alkyl side chains has been proposed (Stranks 2013a; Stranks 2013b). However, the prior art does not teach how to effectively take a hydrophobic composite and render the composite hydrophilic. The prior art also does not teach how to successfully perform an enrichment process that yields high purity sc-SWCNT using a hydrophilic conjugated polymer/solvent system.

There remains a need to be able to efficiently disperse enriched sc-SWCNT in polar organic solvents to form stable printable inks.

SUMMARY

In one aspect, there is provided a single-walled carbon nanotube composition comprising: single-walled carbon nanotubes substantially enriched in semiconducting single-walled carbon nanotubes; and, a polymer associated with the semiconducting single-walled carbon nanotubes, the polymer comprising one or more oligoether side groups.

In another aspect, there is provided a process for producing a single-walled carbon nanotube composition substantially enriched in semiconducting single-walled carbon nanotubes, the process comprising:

(a) providing a composite of substantially enriched semiconducting single-walled carbon nanotubes and a first conjugated polymer where the first conjugated polymer does not comprise oligoether side groups, and exchanging the first conjugated polymer with a second conjugated polymer comprising one or more oligoether side groups by contacting the composite with the second conjugated polymer to form a carbon nanotube composition substantially enriched in semiconducting single-walled carbon nanotubes; or, (b) contacting a single-walled carbon nanotube mixture containing both semiconducting and metallic single-walled carbon nanotubes with the second conjugated polymer to form the carbon nanotube composition substantially enriched in semiconducting single-walled carbon nanotubes.

In another aspect, there is provided an ink composition comprising the single-walled carbon nanotube composition dispersed in a polar organic solvent.

In another aspect, there is provided a polymer compound of Formula (Ia):

where: $Ar_1$ is an aromatic unit that provides a pi-pi interaction with semiconducting single-walled carbon nanotubes; $Ar_2$ is different from $Ar_1$ and is an aromatic unit that provides an additional interaction with the semiconducting single-walled carbon nanotubes; Q is a bridging group; R is a $C_{1-20}$ saturated hydrocarbyl group or a $C_{2-20}$ unsaturated hydrocarbyl group; y is 1 or 2; z is 1, 2, 3, 4, 5 or 6; and, n is an integer from 10 to 1,000.

Compositions described herein permit the production of enriched sc-SWCNT inks that are compatible with common printing methods. For example, the present invention enables formulation of high purity sc-SWCNT into hydrophilic, inkjet, flexo/gravure inks with reduced excipient compared to aqueous dispersion and provides compatible ink systems for large scale R2R commercial printing. High purity sc-SWCNT may be used in a variety of applications, for example in printed electronic devices seeking high current densities, high mobility, low voltage, low power consumption and/or greater flexibility as the main attributes.

Further features will be described or will become apparent in the course of the following detailed description. It should be understood that each feature described herein may be utilized in any combination with any one or more of the other described features, and that each feature does not necessarily rely on the presence of another feature except where evident to one of skill in the art.

BRIEF DESCRIPTION OF THE DRAWINGS

For clearer understanding, preferred embodiments will now be described in detail by way of example, with reference to the accompanying drawings, in which.

DETAILED DESCRIPTION

Single-walled carbon nanotube (SWCNT) compositions of the present invention are substantially enriched in semiconducting single-walled carbon nanotubes (sc-SWCNT). Preferably, the composition comprises about 95 wt % or more sc-SWCNT, more preferably about 99 wt % or more sc-SWCNT, based on total weight of all the carbon nanotubes (CNT) in the composition. Thus, the amount of metallic single-walled carbon nanotubes (m-SWCNT) is preferably less than about 5 wt %, more preferably less than about 1 wt %, of all the CNT in the composition. Such purity level is suitable for many applications of sc-SWCNT in electronic devices.

The semiconducting single-walled carbon nanotubes in the composition are associated with a polymer comprising one or more oligoether side groups. The oligoether side groups make the polymer hydrophilic, and associating the polymer with the sc-SWCNT thereby renders the sc-SWCNT hydrophilic making the composition stably dispersable (e.g. soluble or suspendable) in polar organic solvents. Thus, dispersing the composition in the polar organic solvent permits formulating stable inks comprising sc-SWCNT enriched SWCNT in polar organic solvents, which may be printed by common printing methods.

The polymer comprising one or more oligoether side groups preferably comprises a conjugated polymer (CP). The conjugated polymer preferably comprises at least one repeating unit that provides a pi-pi interaction with the semiconducting single-walled carbon nanotubes. The conjugated polymer may comprise at least one other repeating unit that provides an additional interaction with the semiconducting single-walled carbon nanotubes. The additional interaction may also be a pi-pi interaction or may be a different type of interaction, for example a Van der Waals interaction, a charge transfer interaction, etc. The polymer may also wrap around the semiconducting single-walled carbon nanotubes.

In one embodiment, the polymer is a polymer compound of Formula (I):

where: $Ar_1$ is an aromatic unit that provides a pi-pi interaction with semiconducting single-walled carbon nanotubes; $Ar_2$ is absent, the same as $Ar_1$ or different from $Ar_1$ and when present is an aromatic unit that provides an additional interaction with the semiconducting single-walled carbon nanotubes; Q is a bridging group; R is H or a $C_{1-20}$ saturated hydrocarbyl group or a $C_{2-20}$ unsaturated hydrocarbyl group; y is 1 or 2; z is 1, 2, 3, 4, 5 or 6; and, n is an integer from 10 to 1,000.

The bridging group, Q, is preferably an alkylene group. The alkylene group is preferably a branched or unbranched $C_5$, $C_4$, $C_3$, $C_2$ or $C_1$ alkylene group. Q is preferably a methylene group.

R represents a terminal group on the oligoether side chain. R is H, a linear or branched $C_{1-20}$ saturated hydrocarbyl group or a linear or branched $C_{2-20}$ unsaturated hydrocarbyl group. Preferably, R is H or a linear or branched $C_{1-20}$ saturated hydrocarbyl group. R is more preferably H or a linear or branched $C_{1-4}$ saturated hydrocarbyl group. Unsaturated hydrocarbyl groups include groups with one or more carbon-carbon double bonds, one or more carbon-carbon triple bonds or one or more of both carbon-carbon double bonds and carbon-carbon triple bonds. Hydrocarbyl groups may include one or more heteroatoms (e.g. O, S, N) either in the backbone or as side groups. Preferably, the hydrocarbyl group is a linear or branched alkyl group, linear or branched alkenyl group or linear or branched alkynyl group without heteroatoms. More preferably, R is H or a linear or branched $C_{1-4}$ alkyl group, for example, methyl, ethyl, n-propyl, i-propyl, n-butyl, sec-butyl or t-butyl.

The value y represents the number of oligoether side groups bonded to the $Ar_1$ unit. Some polymer compounds of Formula (I) may have one oligoether side group on $Ar_1$, for example when $Ar_1$ is 2,5-thiophene, while other polymer compounds of Formula (I) may have two oligoether side groups on $Ar_1$, for example when $Ar_1$ is 2,7-fluorene. The value z represents the number of repeating ethylene oxide units in one oligoether side group. The value of z may be 1, 2, 3, 4, 5 or 6, preferably 2, 3 or 4, more preferably 3 or 4.

The value n represents the number of repeating units in the polymer. The value n is an integer from 10 to 1,000, preferably 10 to 100.

$Ar_1$ and $Ar_2$ are aromatic units. Aromatic units are cyclic moieties having delocalized pi electrons in the ring. The aromatic units may contain unsubstituted or substituted carbocyclic or heterocyclic groups. The aromatic units preferably comprise one or more 4-membered, 5-membered, 6-membered and/or 7-membered rings. Aromatic units with more than one ring may comprise rings that are connected through a bond or a linear connecting moiety, rings that are fused and/or spirocyclic rings. The aromatic units preferably comprise from 1 to 20 carbon atoms. Heterocyclic aromatic units may comprise one or more of heteroatoms, preferably from 1 to 6 heteroatoms. Heteroatoms include, for example, O, N and S.

Some examples of aromatic ring systems that may be in the aromatic units include benzene, naphthalene, anthracene, fluorene, phenylene, furan, benzofuran, isobenzofuran, pyrrole, indole, isoindole, thiophene, bithiophene, benzothiophene, benzo[c]thiophene, imidazole, benzimidazole, purine, pyrazole, indazole, oxazole, benzoxazole, isoxazole, benzisoxazole, thiazole, benzothiazole, pyridine, bipyridine, quinolone, isoquinoline, pyrazine, quinoxaline, acridine, pyrimidine, quinazoline, pyridazine, cinnoline, phthalazine, tetrazine, triazine and benzothiadiazole. $Ar_1$ and $Ar_2$ are preferably independently fluorene, thiophene, pyridine or pyrrole. $Ar_1$ is preferably 2,7-fluorene or 2,5-thiophene. $Ar_2$ is preferably 2,5-thiophene, 2,5-pyridine, 2,6-pyridine, 2,5-furan or 2,5-pyrrole.

In one embodiment, the polymer compound of Formula (I) comprises both $Ar_1$ and $Ar_2$ units. The presence of $Ar_2$ in the polymer may adjust the interaction of the polymer with the semiconducting single-walled carbon nanotubes to provide greater selectivity for semiconducting single-walled carbon nanotubes.

Some polymer compounds of Formula (I) are known polymers and may be purchased or readily synthesized by known methods. However, polymer compounds of Formula (Ia) may be unknown in the art. To synthesize polymer compounds of Formula (Ia), a synthetic sequence as shown in Scheme 1 may be utilized. Referring to Scheme 1, $Ar_1$, $Ar_2$, Q, R, y, z and n are as defined for the polymer compound of Formula (Ia), while X is a halogen (e.g. C or Br, preferably Br).

Step 1 of the synthesis depicted in Scheme 1 involves reacting a dihaloaromatic compound 1 with a tosyloligoether 2 to link one or more oligoether side groups to the aromatic unit $Ar_1$ thereby forming an oligoether-substituted dihaloaromatic compound 3. The reaction is preferably conducted in a solvent in the presence of a base and a phase transfer catalyst. The solvent is preferably an aprotic polar organic solvent (e.g. dimethylsulfoxide (DMSO)). The base is preferably a strong base, for example a hydroxide (e.g. NaOH, KOH) and the phase transfer catalyst is preferably a quaternary ammonium salt (e.g. benzyltriethylammonium chloride). The reaction may be conducted for a suitable amount of time (e.g. 1-24 hours) at a suitable temperature (e.g. 55-60° C.). Equimolar amounts of 1 and 2 would lead to a mono-substituted product, while a molar ratio of 2:1 for 2:1 would lead to a di-substituted product.

Step 2 of the synthesis involves converting the halo groups X of the oligoether-substituted dihaloaromatic compound 3 to boronic acid (—B(OH)$_2$) groups to form a diboronic acid aromatic compound 4. Step 2 involves treatment of 3 sequentially with (i) n-butyllithium (n-BuLi), then (ii) boron isopropoxide (B(OiPr)$_3$), and finally (iii) quenching the reaction with acid (e.g. a mineral acid such as HCl). Sub-step 2(i) may be accomplished with 2-3 molar equivalents of n-BuLi in an aprotic solvent (e.g. tetrahydrofuran (THF), diethyl ether, and the like) at reduced temperature (e.g. dry ice or liquid nitrogen temperature) for a suitable amount of time (e.g. 0.5-2 hours). Sub-step 2(ii) may be accomplished in the same reaction mixture with 3-5 molar equivalents of B(OiPr)$_3$ at reduced temperature (e.g. dry ice or liquid nitrogen temperature) with slow warming over a suitable period of time (e.g. 5-24 hours). Sub-step 2(iii) may be performed with dilute acid (e.g. 1-6 N) over a suitable period of time (e.g. 0.5-2 hours) at room temperature.

Step 3 of the synthesis involves converting the boronic acid groups of the diboronic acid aromatic compound 4 to pinacol borane groups to form the dipinacol borane aromatic compound 5. In Step 3, the diboronic acid aromatic compound 4 is preferably reacted with 2-4 molar equivalents of pinacol in a solvent, preferably a non-polar organic solvent (e.g. an aromatic solvent such as toluene, benzene or xylene). The reaction is preferably conducted at elevated temperature (e.g. under reflux) for a suitable amount of time (e.g. 1-12 hours).

Scheme 1: Synthesis of Compounds of Formula (Ia)

1

2

3

Step 4 of the synthesis involves reacting the dipinacol borane aromatic compound 5 with a second dihaloaromatic compound 6 to form the polymer compound of Formula (Ia). The reaction is preferably catalyzed with a metal catalyst in a solvent in the presence of a phase transfer catalyst and a base at elevated temperature (e.g. reflux). The metal catalyst may comprise Pt, Pd or the like (e.g. tetrakis triphenylphosphine palladium ($Pd(PPh_3)_4$)). The solvent is preferably a non-polar organic solvent (e.g. an aromatic solvent such as toluene, benzene or xylene). The phase transfer catalyst is preferably a quaternary ammonium salt (e.g. Aliquat 336), which also acts as a metal extraction agent. The base is preferably a weak base (e.g. a carbonate such as sodium or potassium carbonate).

Single-walled carbon nanotube (SWCNT) compositions of the present invention substantially enriched in semiconducting single-walled carbon nanotubes may be prepared by polymer exchange or direct enrichment methods. Both methods involve the use of polymers comprising one or more oligoether side groups to make the polymers dispersable in polar organic solvents.

In a polymer exchange method, a composite of substantially enriched semiconducting single-walled carbon nanotubes and a first conjugated polymer is provided where the first conjugated polymer does not comprise oligoether side groups. The first conjugated polymer is exchanged with a second conjugated polymer comprising one or more oligoether side groups by contacting the composite with the second conjugated polymer to form the carbon nanotube composition substantially enriched in semiconducting single-walled carbon nanotubes.

The first conjugated polymer may be any conjugated polymer that interacts with sc-SWCNT but interacts less strongly with sc-SWCNT than the conjugated polymer that comprises one or more oligoether side groups. Preferably, the first conjugated polymer is a polyfluorene, for example a 9,9-dialkyl-substituted polyfluorene, or a 9,9-$diC_{8-36}$-alkyl-substituted polyfluorene, or a 9,9-$diC_{8-18}$-alkyl-substituted polyfluorene. The alkyl substituent may be linear or branched. The first conjugated polymer preferably has a number average molecular weight ($M_n$) greater than about 8,000 Da, for example from about 8,000 Da to about 500,000 Da, preferably from about 10,000 Da to about 30,000 Da. A particularly preferred first conjugated polymer is poly(9,9-$diC_2$alkylfluorene) (PFDD).

In general in the polymer exchange method, an oligoether-functionalized polymer may be mixed with a dispersion of sc-SWCNT/CP in a polar or non-polar organic solvent, where CP is the first conjugated polymer. The solvent is preferably non-polar. The non-polar organic solvent preferably comprises an aromatic solvent, for example toluene, benzene, ethyl benzene, xylenes, 1-methylnaphthalene or mixtures thereof. Toluene is preferred. The mixture may be agitated, for example by sonication or mechanical agitation, to encourage the oligoether-functionalized polymer to interact with the surface of the sc-SWCNT and displace the first conjugated polymer. The mixture may then be subjected to a suitable isolation technique (e.g. filtration, centrifugation or the like) to remove the first conjugated polymer to yield hydrophilic single-walled carbon nanotube compositions substantially enriched in semiconducting single-walled carbon nanotubes. Because the main chain of the oligoether-functionalized polymer has a stronger interaction with the sc-SWCNT than does the main chain of the first conjugated polymer, polymer displacement may be complete. The isolated hydrophilic single-walled carbon nanotube compositions substantially enriched in semiconducting single-walled carbon nanotubes may then be formulated into an ink composition by dispersion in a polar organic solvent.

In a direct enrichment method, a single-walled carbon nanotube mixture containing both semiconducting single-walled carbon nanotubes (sc-SWCNT) and metallic single-walled carbon nanotubes (m-SWCNT) is contacted with a conjugated polymer comprising one or more oligoether side groups to form a hydrophilic carbon nanotube composition substantially enriched in semiconducting single-walled carbon nanotubes.

In general in the direct enrichment method, an as-synthesized mixture of sc-SWCNT and m-SWCNT may be dispersed in a polar organic solvent in the presence of the conjugated polymer comprising one or more oligoether side groups. The mixture of sc-SWCNT and m-SWCNT is preferably dispersed in the polar organic solvent at a concentration of from about 0.1 mg/mL to about 10.0 mg/mL, preferably about 0.4 mg/mL to about 2.0 mg/mL, with a polymer/SWCNT ratio of 0.5:1 to 10:1. The polymer/SWCNT ratio may impact the extraction yield and sc-purity. A high ratio may produce a high yield but a low purity. Formation of the dispersion may be assisted by known techniques in the art, for example, sonication, mechanical agitation and the like. Subsequent separation of the well-dispersed SWCNT from the poorly-dispersed SWCNT collects polymer-coated SWCNT in the dispersion, while poorly-dispersed SWCNT are removed. The subsequent separation may be accomplished by any suitable method, for example centrifugation, filtration and the like, or any combination thereof. Centrifugation is preferred. Such centrifugation typically yields sediment and supernatant, the sediment having gravitated to the bottom of a centrifuge tube and the supernatant being the liquid on top. The sediment is enriched in m-SWCNT and the supernatant is enriched in sc-SWCNT, relative to the starting mixture. Because the conjugated polymer selectively interacts with the sc-SWCNT to keep them dispersed, the SWCNT remaining in the dispersion (e.g. in the supernatant) after separation are enriched in sc-SWCNT, while the SWCNT separated from the dispersion (e.g. in the sediment) are enriched in m-SWCNT. More extraction processes can be applied to the sediment and the resulting combination dispersion may give a higher yield of sc-SWCNT. The polar organic solvent dispersion of sc-SWCNT wrapped in hydrophilic polymer produced by the direct enrichment method may be further processed to formulate a desired ink composition. To achieve optimized sc-purity for the polymer extraction, the polarity of the solvent may be adjusted by adding small amount of a non-polar solvent (e.g. toluene) into the polar solvent, preferably in an amount of about 2-50 wt %, more preferably 5-25 wt %.

Ink compositions may be formulated by dispersing the single-walled carbon nanotube composition in a polar organic solvent. The single-walled carbon nanotube composition may be dissolved or suspended in the solvent. The single-walled carbon nanotube composition may be dispersed in the polar organic solvent in any amount suitable for the desired printing method. For example, the single-walled carbon nanotube composition may be present in the ink composition in a single-walled carbon nanotube concentration of about 0.1-500 ppm, based on total weight of the ink composition, or about 0.1-500 mg/L. Preferably the single-walled carbon nanotube concentration is about 5-50 ppm, or about 10-30 ppm.

Polar organic solvents may comprise, for example, an ether, an alcohol, an amide, a ketone, a sulfoxide, an ester, a carbonate, a carboxylic acid or mixtures thereof. An example of an alcohol is octanol. An ether or a mixture of ethers is preferred. Some examples of ethers include diethyl ether, tetrahydrofuran, dioxane, diethylene glycol, triethylene glycol, carbitols, and mixtures thereof. Oligoethers end-capped by alkyl groups are preferred. Carbitols are preferred. A particularly preferred class of polar organic solvents comprises alkyl carbitols. Alkyl carbitols are di(ethylene glycol) monoethers. Preferred alkyl carbitols are alkyl carbitols of Formula (II):

(II)

where $R_1$ is methyl, ethyl, propyl, butyl or pentyl. Preferably, $R_1$ is methyl, ethyl or butyl, in which case the alkyl carbitol of Formula (II) is methyl carbitol (MC), ethyl carbitol (EC) or butyl carbitol (BC), respectively.

The polar organic solvent may also contain small amounts of non-polar organic solvents without unduly affecting printing performance of the ink. Some examples of non-polar organic solvents include aromatic solvents (e.g. benzene, toluene, ethylbenzene, xylenes, chlorobenzene, benzyl ether, anisole, benzonitrile, pyridine, diethylbenzene, propylbenzene, cumene, isobutylbenzene, p-cymene, tetralin, trimethylbenzenes (e.g. mesitylene), durene, p-cumene or any mixture thereof) and alkanes (e.g. pentanes, hexanes, heptanes, etc.). Preferred non-polar organic solvents are toluene, xylene, anisole, diethylbenzene or any mixture thereof. The amount of non-polar organic solvent in the solvent mixture is preferably 20% v/v or less, more preferably 15% v/v or less, yet more preferably 10% v/v or less.

The ink composition may also comprise one or more binders. Preferably, the one or more binders is present in the ink composition in an amount of about 0.1-500 ppm, preferably about 5-50 ppm, based on total weight of the ink composition. The binder is preferably a polymeric binder. The binder preferably comprises ethyl cellulose, polypyrrolidone, epoxies, phenolic resins, acrylics, urethanes, silicones, styrene allyl alcohols, polyalkylene carbonates, polyvinyl acetals, polyesters, polyurethanes, polyolefins, fluoroplastics, fluoroelastomers, thermoplastic elastomers or any mixture thereof.

Common printing methods for ink compositions include, for example, screen printing, inkjet printing, flexography printing (e.g. stamps), gravure printing, off-set printing, airbrushing, aerosol printing, typesetting, or any other method. These printing techniques may all be used in a roll-to-roll (R2R) manner. After printing, the ink composition may be dried or cured, for example by allowing the ink composition to dry in ambient conditions or heating the ink composition for an appropriately long period of time to evaporate the solvent. The ink compositions are particularly suited to inkjet, roll-to-roll, flexography and gravure printing.

The ink composition may be printed on to any suitable substrate. Printable substrates may include, for example polyethylene naphthalate (PEN), polyethylene terephthalate (PET) (e.g. Melinex™), PEN-PET, polyolefin (e.g. silica-filled polyolefin (Teslin™)), polydimethylsiloxane (PDMS), polystyrene, polycarbonate, polyimide (e.g. Kapton™), silione membranes, textiles (e.g. cellulosic textiles), paper, glass, metal, dielectric coatings, among others. The printed substrate may be incorporated into an electronic device, for example electrical circuits (e.g. logic circuits), conductive bus bars (e.g. for photovoltaic cells), antennae (e.g. RFID antennae), detectors, sensors (e.g. touch sensors), transistors (e.g. thin film transistors (TFTs)), diodes, smart packaging (e.g. smart drug packaging) and backplanes/drivers for OLED and electrophoretic displays.

EXAMPLES

Example 1: Sc-SWCNT/PMO(EO)$_3$MT Inks in Ethyl Carbitol (EC) Based on Polymer Exchange 1.0 ml of a PFDD/CNT solution ($C_{CNT}$=about 1.0 mg/mL) was combined with 16 mg of poly(3-(2-(2-(-2-methoxyethoxy)ethoxy)ethoxy)methyl)thiophene) (PMO(EO)$_3$MT, Scheme 2) in 5 mL of toluene. The mixture was bath sonicated (Branson 2510 sonicator) for 10 min, and was filtered to collect a solid. The solid was then combined with 2.0 mL of ethyl carbitol (EC) and bath sonicated for 20 min to form a stable homogeneous solution.

Scheme 2 - Structure of PMO(EO)$_3$MT

Figure 1:
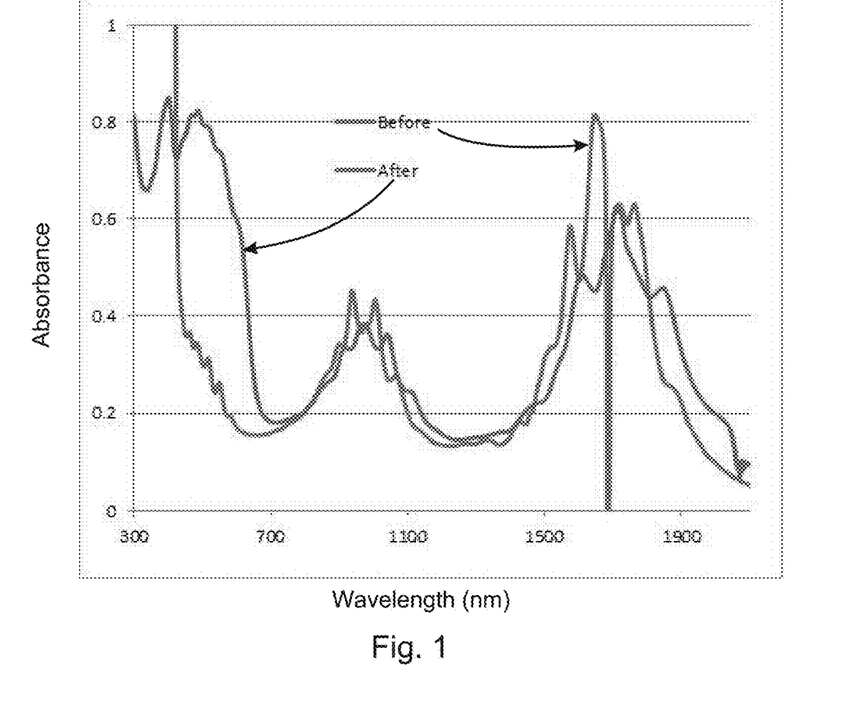
FIG. 1 depicts absorption spectra of an original sc-SWCNTs/PFDD solution in toluene prepared by poly(9,9-$diC_{12}$alkylfluorene) (PFDD) extraction (Before), and the solution in ethyl carbitol (EC) after polymer exchange with $PMO(EO)_3MT$ (After)

The UV spectrum of the formed sc-SWCNT/PMO(EO)₃MT solution (After) in EC was compared with the original sc-SWCNT/PFDD solution (Before) in FIG. 1. The UV spectra indicate that the PFDD absorption peak at about 380 nm was significantly reduced after the polymer exchange. Though about 10-20% residual PFDD remains in the sample, dispersing the sc-SWCNT in ethyl carbitol (EC) is not precluded. The residual PFDD can be almost completely removed by an additional polymer exchange using the same conditions as previously described. However, for the ink preparation in EC, the additional polymer exchange is not required because the composite material from the initial polymer exchange process can be well dispersed in EC. The UV spectrum of the resulting composite shows about a 30 nm red-shift for the absorption peaks of the nanotubes, indicating a much stronger interaction with the thiophene polymer compared to PFDD.

Example 2: Sc-SWCNT/PF(EO)₃M-Py-2,5 Inks in Ethyl Carbitol (EC) Based on Polymer Exchange A. Polymer Synthesis Poly(9,9-bis(2-(2-(-2-methoxyethoxy)ethoxy)ethyl)fluorene-alt-pyridine-2,5) (PF(EO)₃M-Py-2,5) was prepared following a route indicated in Scheme 3 comprising four reactions.

Reaction 1. The preparation of 2,7-dibromo-9,9-bis (2-(2-(-2-methoxyethoxy)ethoxy)ethyl) fluorene 16.2 g (50 mmol) of 2,7-dibromofluorene, 33.4 g (105 mmol) of 2-(2-(-2-methoxyethoxy)ethoxy)ethyl-4-toluenesulfonate, and 0.80 g of benzyltriethylammonium chloride were added into 250 mL of DMSO in a 500 mL flask. 25 mL of 50% NaOH solution was then added to the mixture drop by drop with vigorous stirring so that the temperature was maintained at 55-60° C. The temperature was then kept at 55° C. overnight to complete the reaction. After cooling to room temperature, 200 mL of $H_2O$ was added to the mixture with stirring, and the mixture was extracted with 200 mL of diethyl ether three times. The combined organic layer was washed with 100 mL of brine 5 times and dried over $MgSO_4$. The solvent was removed using a rotary evaporator and the obtained light yellow oil was purified by column chromatography on silica gel using 50/50 hexanes/ethyl acetate as eluent (Rf about 0.35) to afford pure product as light yellow oil at a yield of 61%.

Reaction 2. The preparation of 9,9-bis(2-(2-(-2-methoxyethoxy)ethoxy)ethyl) fluorene-2,7-diboronic acid 18.4 g (29.9 mmol) of 2,7-dibromo-9,9-bis(2-(2-(-2-methoxyethoxy) ethoxy)ethyl)fluorene was dissolved in 300 mL of anhydrous THE under the protection of argon. The solution was cooled to −78° C. and 23.6 mL (65.7 mmol) 2.5 M n-BuLi was added dropwise to the mixture followed by stirring for 1 h at a temperature lower than −40° C. The reaction solution was cooled to −78° C. again and 23.6 g (126 mmol) of $B(OiPr)_3$ was quickly added to the mixture. The reaction mixture was allowed to warm to room temperature and stirred overnight. 50 mL (200 mmol) of 4 N HCl was added at 0° C. and stirred for 30 min. The aqueous layer was separated and extracted twice with 100 mL diethyl ether. The combined organic layer was washed with 50 mL of brine three times and then dried over $MgSO_4$. After filtration to remove $MgSO_4$, the solution was concentrated using a rotary evaporator and the residual was washed with hexanes and dried under vacuum.

Reaction 3. The preparation of 9,9-bis(2-(2-(-2-methoxyethoxy)ethoxy)ethyl)fluorene-2,7-bis(pinacolato boron)

The product of Reaction 2 (29.9 mmol) was dissolved in 300 mL of toluene. 10.6 g (90.0 mmol) of pinacol was added. The mixture was heated to reflux. The water produced in the reaction was removed using a Dean-Stark trap. This reaction was completed in 3 h. After cooling to room temperature, the reaction solution was washed twice with 50 mL of water, dried over $MgSO_4$ and then the solvent was removed by a rotary evaporator. The residual was purified by washing with hexanes twice and then recrystallized in hexanes to afford white crystal at a combined yield of 68% for Reaction 2 and 3.

Reaction 4. The Preparation of (PF(EO)₃M-Py-2,5)

4.306 g (6.06 mmol) of 9,9-bis(2-(2-(-2-methoxyethoxy) ethoxy)ethyl)fluorene-2,7-bis(pinacolato boron), 1.421 g (6.00 mmol) of 2,5-dibromopyridine and 3 drops of Aliquat 336 was dissolved in 50 mL of toluene in a 150 mL flask, which was equipped with a stirring bar and a condenser. 20 mL (40.0 mmol) of 2 M NaOH solution was added. The system was degassed and purged with argon three times. 70 mg (0.06 mL) of $Pd(PPh_3)_4$ was added into the flask in a glove box. The mixture was heated to reflux with stir, and was maintained for 3 days. After cooling to room temperature, the water layer was removed in a separating funnel. The organic layer was gently rinsed twice with 20 mL water, and then was dropped into 600 mL of MeOH with agitation to precipitate the polymer, which was collected by filtration and dried under vacuum.

Figure 2:
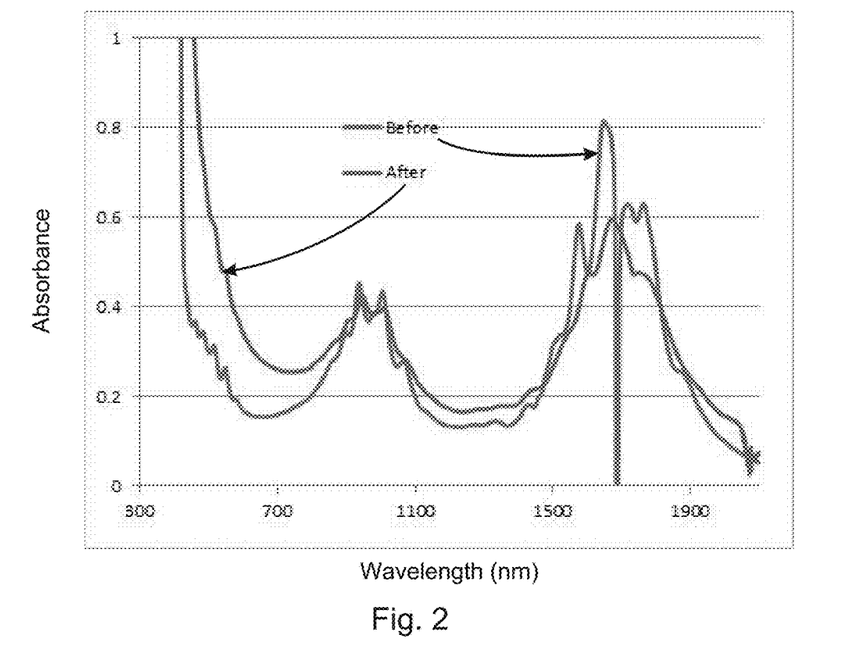
FIG. 2 depicts absorption spectra of an original sc-SWCNT'PFDD solution in toluene prepared by poly(9,9-$diC_{12}$alkylfluorene) (PFDD) extraction (Before), and the solution in ethyl carbitol (EC) after polymer exchange with $PF(EO)_3M$-Py-2,5 (After).

B. Polymer Exchange 16 mg of PF(EO)₃M-Py-2,5 was dissolved in 10 mL of TH/toluene mixture (1/1) and then mixed with 1.0 ml of a PFDD/CNT solution ($C_{CNT}$=about 1.0 mg/mL). About 50% THE was used in the solution due to limited solubility of PF(EO)₃M-Py-2,5 in toluene. The mixture was bath sonicated for 10 min and was filtered to collect the solid, which was dispersed into 2 mL of ethyl carbitol (EC) with 20 min sonication (Branson 2510 sonicator) to yield a micelle-like solution. The UV spectrum of the micelle-like solution in EC (After) was collected and compared with the original solution in toluene (Before) in FIG. 2. The UV spectra display about a 5 nm red-shift of the nanotube absorption peaks after polymer exchange, indicating a stronger interaction of the nanotubes with the fluorene/pyridine copolymer (PF(EO)₃M-Py-2,5) compared to the fluorene homopolymer (PFDD).

Example 3: sc-SWCNT/PF(EO)₃M-Py-2,5 Inks Based on Polymer Extraction

In order to simplify processing and reduce cost, a hydrophilic polymer may be used directly for enrichment of sc-SWCNT from an as prepared mixture of CNTs comprising sc-SWCNT and m-SWCNT.

Figure 3:
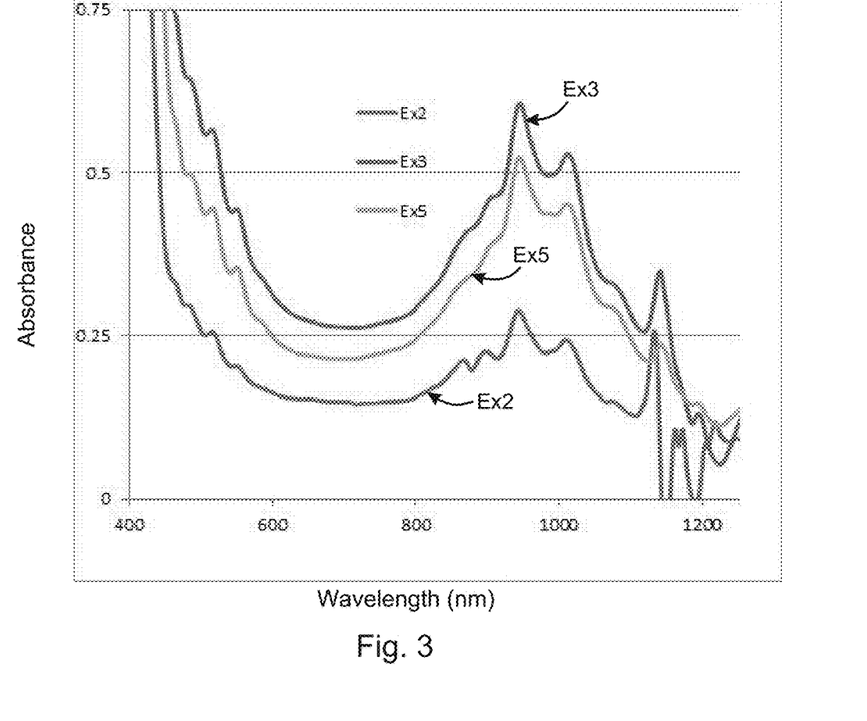
FIG. 3 depicts absorption spectra of supernatants obtained from the 2nd, 3rd, and 5th extractions using $PF(EO)_3M$-Py-2,5 in toluene/ethyl carbitol (about 1/9 ratio).

In EC/Toluene (9/1) Mixture 20 mg of Raymor plasma SWCNT RN-000 and 20 mg of PF(EO)$_3$M-Py-2,5 was added to 25 mL of an ethyl carbitol (EC)/toluene (9/1) solvent mixture. The mixture was horn sonicated (Branson sonicator with mini-tip, cycle 60%, output 20%) for 30 min at about 30° C., and then centrifuged at 12,500 rpm (SS-34 rotor, RCF: 18,700 g) for 30 min. The supernatant was collected and marked as Ex1. The extraction process was repeated four times on the sediment from the previous extraction to obtain the supernatant of 2nd (Ex2), 3rd (Ex3), 4th (Ex4), and 5th (Ex5) extractions. Ex1 is a clear transparent solution and does not show any nanotube absorption peaks in the UV spectrum. The UV spectra of Ex2, Ex3, and Ex5 are shown in FIG. 3. The spectra indicate high sc-SWCNT purity in the supernatants, with the absence of m-SWCNT peaks at about 700 nm.

In Pure EC

Figure 4:
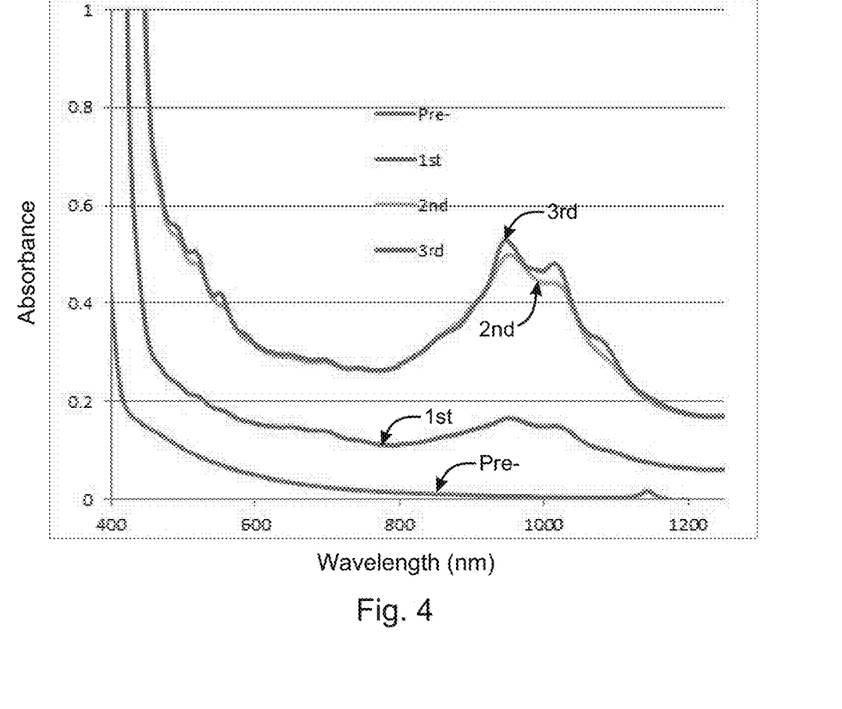
FIG. 4 depicts absorption spectra of supernatant obtained from all 4 extractions (Pre-, 1st, 2nd and 3rd) using $PF(EO)_3M$-Py-2,5 in pure ethyl carbitol (EC).

The polymer extraction process described above was further tested in pure ethyl carbitol (EC) under the same conditions. UV spectra of the supernatants from the extraction are shown in FIG. 4. The UV spectra indicate that sc-SWCNT purity of the obtained product is not as good as the product obtained from the toluene/EC solvent mixture. The reduction in sc-SWCNT purity may be attributed to the higher polarity of the solvent used in this experiment, which is pure EC, a highly polar organic solvent.

In Pure EC with Less Polymer

Figure 5:
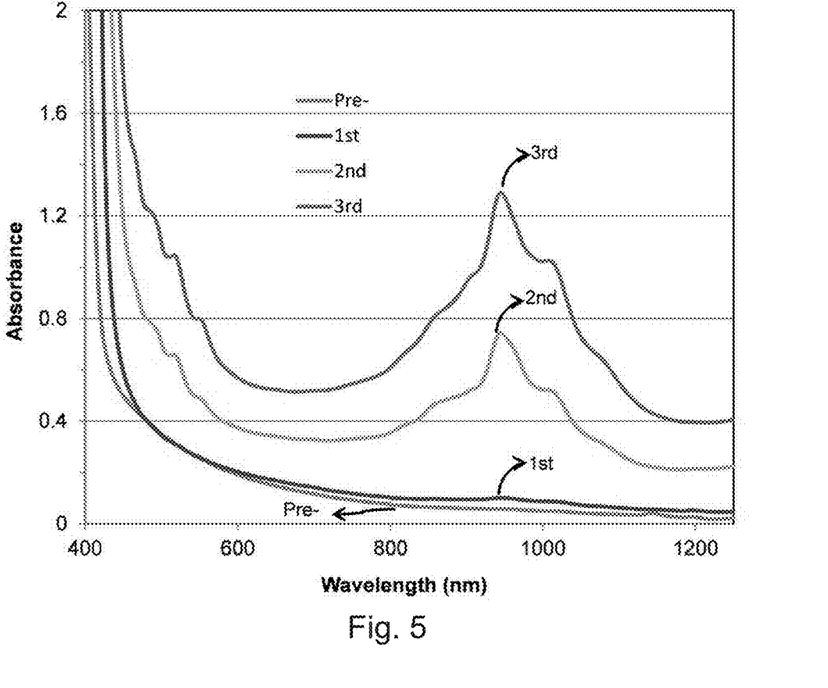
FIG. 5 depicts absorption spectra of supernatants obtained from all 4 extractions (Pre-, 1st, 2nd and 3rd) using $PF(EO)_3M$-Py-2,5 in ethyl carbitol (EC) with 0.5-to-1 of polymer-to-SWCNTs ratio.

The polymer extraction process described above was further tested in pure ethyl carbitol (EC) with a lower ratio of polymer-to-SWCNTs. 6.4 mg of Raymor plasma SWCNT RN-000 and 3.2 mg of PF(EO)$_3$M-Py-2,5 was added to 8 mL ethyl carbitol (EC). Absorption spectra of the supernatants from the extraction are shown in FIG. 5. The absorption spectra, with the absence of m-SWCNT peaks at about 700 nm, indicate that sc-SWCNT purity of the obtained product is improved as compared to that extracted with a higher ratio of polymer-to-SWCNTs. The improvement in sc-SWCNT purity may be attributed to the selectivity towards sc- over m-SWCNTs. With less polymer, the enrichment of sc-SWCNTs improves.

In Pure MC

Figure 6:
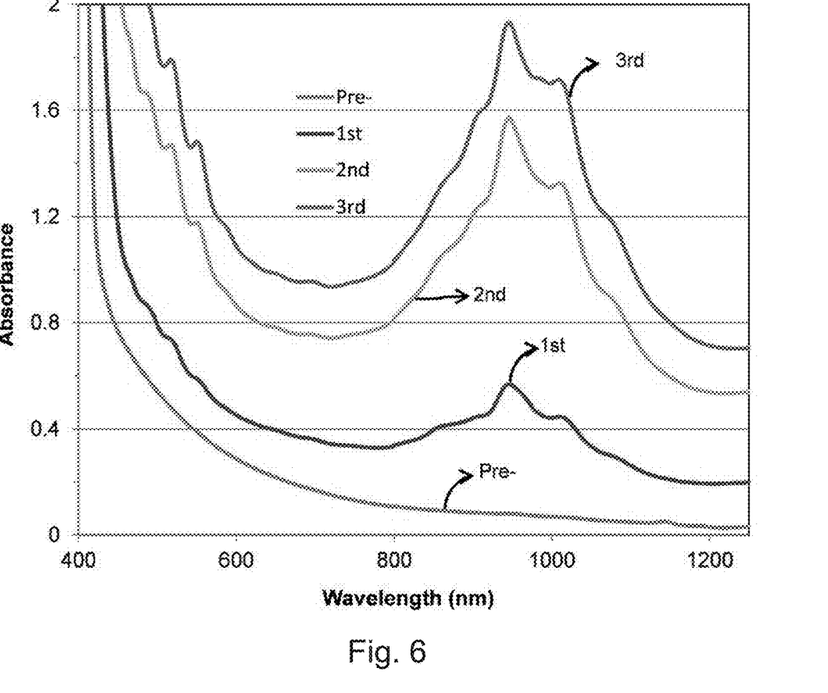
FIG. 6 depicts absorption spectra of supernatants obtained from all 4 extractions (Pre-, 1st, 2nd and 3rd) using $PF(EO)_3M$-Py-2,5 in methyl carbitol (MC) with 0.5-to-1 of polymer-to-SWCNTs ratio.

The polymer extraction process described above was further tested in pure methyl carbitol (MC). 6.4 mg of Raymor plasma SWCNT RN-000 (self-purified) and 3.2 mg of PF(EO)$_3$M-Py-2,5 was added to 8 mL methyl carbitol (MC). Absorption spectra of the supernatants from the extraction are shown in FIG. 6. The absorption spectra, with the absence of m-SWCNT peaks at about 700 nm, indicate that sc-SWCNT purity of the obtained product is comparable to that extracted with EC (see FIG. 5). In addition, the yield of enriched sc-SWCNTs is about double that extracted with EC.

In Pure 1,4-dioxane

Figure 7:
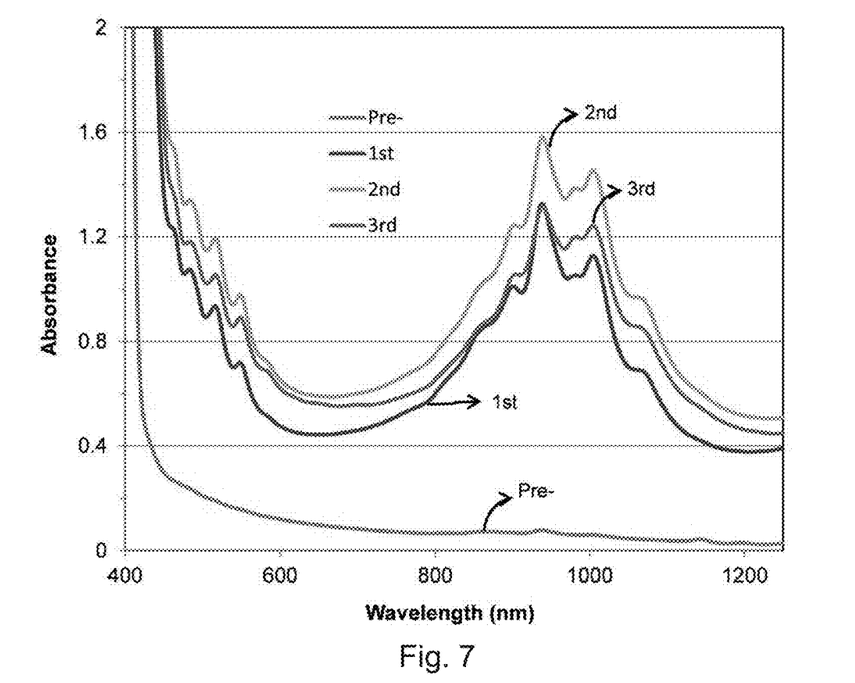
FIG. 7 depicts absorption spectra of supernatants obtained from all 4 extractions (Pre-, 1st, 2nd and 3rd) using $PF(EO)_3M$-Py-2,5 in 1,4-dioxane with 0.5-to-1 of polymer-to-SWCNTs ratio.

The polymer extraction process described above was further tested in pure 1,4-dioxane. 6.4 mg of Raymor plasma SWCNT RN-000 (self-purified) and 3.2 mg of PF(EO)$_3$M-Py-2,5 was added to 8 mL 1,4-dioxane. Absorption spectra of the supernatants from the extraction are shown in FIG. 7. The absorption spectra, with the absence of m-SWCNT peaks at about 700 nm, indicate that sc-SWCNT purity of the obtained product is much better than that extracted in carbitol solvents. In addition, the yield of enriched sc-SWCNTs is similar to that extracted with MC.

Figure 8:
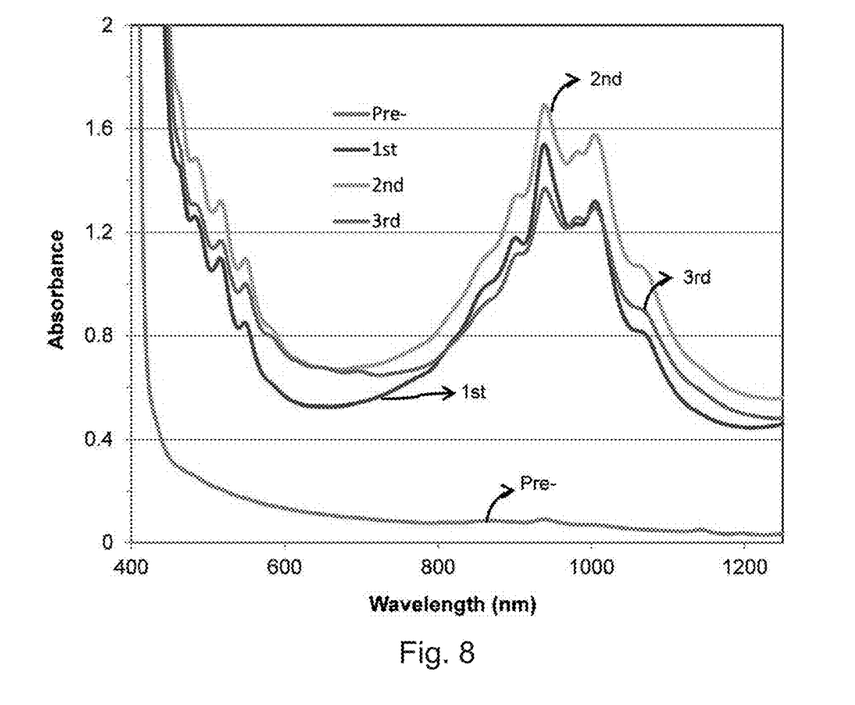
FIG. 8 depicts absorption spectra of supernatants obtained from all 4 extractions (Pre-, 1st, 2nd and 3rd) using $PF(EO)_3M$-Py-2,5 in 1,4-dioxane with 0.25-to-1 of polymer-to-SWCNTs ratio.

The polymer can be further reduced. 6.4 mg of Raymor plasma SWCNT RN-000 and 1.6 mg of PF(EO)$_3$M-Py-2,5 was added to 8 mL 1,4-dioxane. Absorption spectra of the supernatants from the extraction are shown in FIG. 8.

In Pure Tetrahydrofuran

Figure 9:
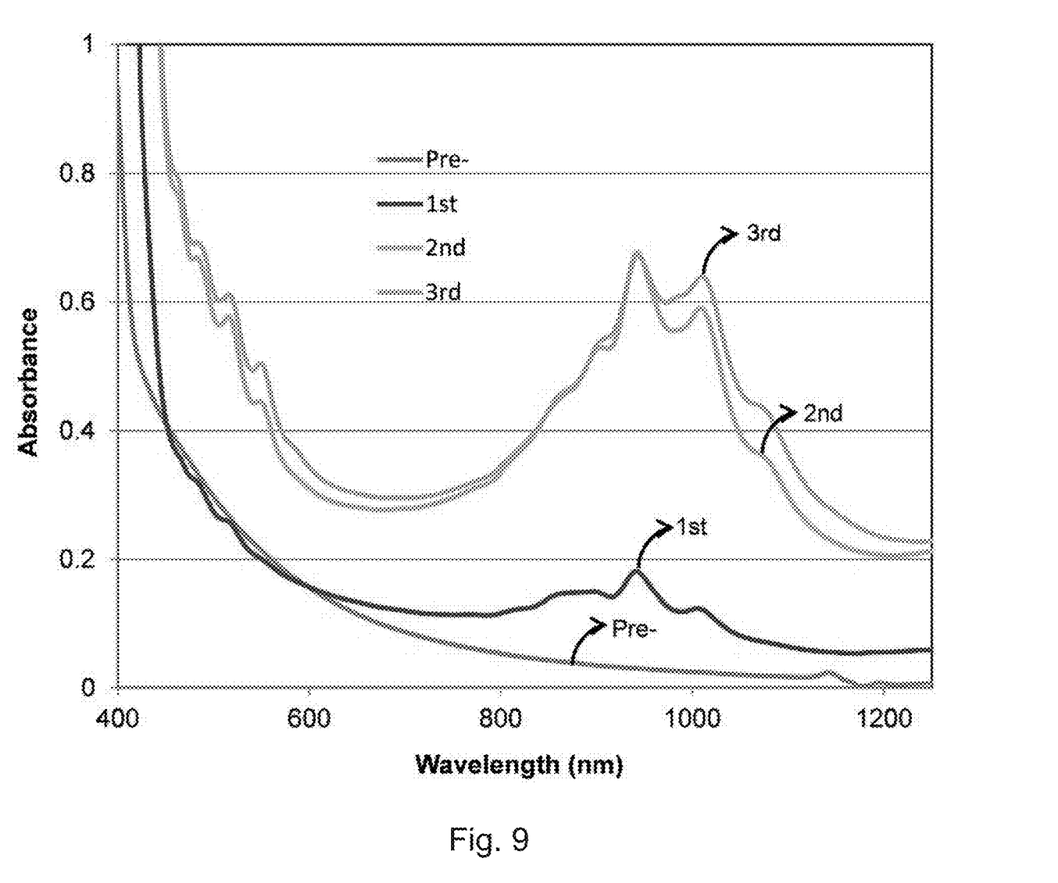
FIG. 9 depicts absorption spectra of supernatants obtained from all 4 extractions (Pre-, 1st, 2nd and 3rd) using $PF(EO)_3M$-Py-2,5 in tetrahydrofuran (THF) with 0.25-to-1 of polymer-to-SWCNTs ratio.

The polymer extraction process described above was further tested in pure tetrahydrofuran (THF). 6.4 mg of Raymor plasma SWCNT RN-000 (self-purified) and 1.6 mg of PF(EO)$_3$M-Py-2,5 was added to 8 mL THF. Absorption spectra of the supernatants from the extraction are shown in FIG. 9. The absorption spectra, with the absence of m-SWCNT peaks at about 700 nm, indicate that sc-SWCNT purity of the obtained product is comparable to that extracted with 1,4-dioxane (see FIG. 8). However, the yield of enriched sc-SWCNTs is 1/3 of that extracted with 1,4-dioxane.

References: The contents of the entirety of each of which are incorporated by this reference.

Ding J, Li Z, Lefebvre J, Cheng F, Dubey G, Zou S, Finnie P, Hrdina A, Scoles L, Lopinski G P, Kingston C T, Simard B, Malenfant P R L. (2014) Enrichment of large-diameter semiconducting SWCNTs by polyfluorene extraction for high network density thin film transistors. Nanoscale. 6, 2328-2339.

Ding J, Li Z, Cheng F, Simard B, Malenfant P R L. (2015) Process for purifying semiconducting single-walled carbon nanotubes. International Patent Publication WO 2015/024115 published Feb. 26, 2015.

Liu G, Johnson S, Kerr J, Minor A, Mao S. (2011) Carbon nanotube polymer composition and devices. U.S. Pat. No. 7,960,037 issued Jun. 14, 2011.

Pei Q, Yu G, Yang Y. (1999) Polyfluorenes as Materials for Photoluminescence and Electro Luminescence. U.S. Pat. No. 5,900,327 issued May 4, 1999.

Stay D, Lonergan M C. (2013) Varying Anionic Functional Group Density in Sulfonate-Functionalized Polyfluorenes by a One-Phase Suzuki Polycondensation. *Macromolecules*. 46, 4361-4369.

Stranks S D, Baker A M R, Alexander-Webber J A, Dirks B, Nicholas R J. (2013a) Production of High-Purity Single-Chirality Carbon Nanotube Hybrids by Selective Polymer Exchange. Small. 9(13), 2245-2249.

Stranks S D, Habisreutinger S N, Dirks B, Nicholas R J. (2013b) Novel Carbon Nanotube-Conjugated Polymer Nanohybrids Produced By Multiple Polymer Processing. Adv. Mater. 25, 4365-4371.

Wang H, Hsieh B, Jiménez-Osés G, Liu P, Tassone C J, Diao Y, Lei T, Houk K N, Bao Z. (2015) Solvent Effects on Polymer Sorting of Carbon Nanotubes with Applications in Printed Electronics. Small. 11(1), 126-133.

The novel features will become apparent to those of skill in the art upon examination of the description. It should be understood, however, that the scope of the claims should not be limited by the embodiments, but should be given the broadest interpretation consistent with the wording of the claims and the specification as a whole.

The invention claimed is:

1. A single-walled carbon nanotube composition comprising: single-walled carbon nanotubes having 95 wt % or more of semiconducting single-walled carbon nanotubes, based on total weight of the single-walled carbon nanotubes; and, a polymer associated with the semiconducting single-walled carbon nanotubes, the polymer comprising one or more oligoether side groups, wherein the conjugated polymer is a conjugated polymer of Formula (I):

where:
- Ar$_1$ is an aromatic unit that provides a pi-pi interaction with semiconducting single-walled carbon nanotubes;
- Ar$_2$ is different from Ar$_1$ and is an aromatic unit that provides an additional interaction with the semiconducting single-walled carbon nanotubes;
- Q is methylene;
- R is H or a C$_{1-20}$ saturated hydrocarbyl group or a C$_{2-20}$ unsaturated hydrocarbyl group;
- y is 1 or 2;
- z is 1, 2, 3, 4, 5, or 6; and,
n is an integer from 10 to 1,000.

2. The composition according to claim 1, wherein the single-walled carbon nanotubes comprise 99 wt % or more semiconducting single-walled carbon nanotubes, based on total weight of the single-walled carbon nanotubes.

3. The composition according to claim 1, wherein R is H or a C$_{1-4}$ alkyl group.

4. The composition according to claim 1, wherein z is 3 or 4, n is 10 to 100, or z is 3 or 4 and n is 10 to 100.

5. The composition according to claim 1, wherein:
- Ar$_1$ is 2,7-fluorene or 2,5-thiophene;
- Ar$_2$ is 2,5-thiophene, 2,5-pyridine, 2,6-pyridine, 2,5-furan or 2.5-pyrrole; or
- Ar$_1$ is 2,7-fluorene or 2,5-thiophene and Ar$_2$ is 2,5-thiophene, 2,5-pyridine, 2,6-pyridine, 2,5-furan or 2.5-pyrrole.

6. The composition according to claim 1, wherein Ar$_1$ and Ar$_2$ are independently benzene, naphthalene, anthracene, fluorene, phenylene, furan, benzofuran, isobenzofuran, pyrrole, indole, isoindole, thiophene, bithiophene, benzothiophene, benzo[c]thiophene, imidazole, benzimidazole, purine, pyrazole, indazole, oxazole, benzoxazole, isoxazole, benzisoxazole, thiazole, benzothiazole, pyridine, bipyridine, quinolone, isoquinoline, pyrazine, quinoxaline, acridine, pyrimidine, quinazoline, pyridazine, cinnoline, phthalazine, tetrazine, triazine or benzothiadiazole.

7. An ink composition comprising the single-walled carbon nanotube composition as defined in claim 1 dispersed in a polar organic solvent.

8. The ink composition according to claim 7, wherein the polar organic solvent comprises an alcohol, an amide, a ketone, a sulfoxide, an ester, a carbonate, a carboxylic acid or mixtures thereof.

9. The ink composition according to claim 7, wherein the polar organic solvent comprises an ether.

10. The ink composition according to claim 7, wherein the polar organic solvent comprises THF, dioxane, diethylene glycol, triethylene glycol, octanol, a carbitol or a mixture thereof.

11. The ink composition according to claim 7, wherein the polar organic solvent comprises an oligoether end-capped by an alkyl group.

12. The ink composition according to claim 7, wherein the polar organic solvent comprises an alkyl carbitol.

13. The ink composition according to claim 7, wherein the polar organic solvent comprises an alkyl carbitol of Formula (II):

where R$_1$ is methyl, ethyl, propyl, butyl or pentyl.

14. The ink composition according to claim 7, further comprising a binder.

* * * * *